United States Patent [19]

Beason et al.

[11] Patent Number: 5,526,235
[45] Date of Patent: Jun. 11, 1996

[54] ELECTRONIC STORAGE DEVICE AND RECEPTACLE

[75] Inventors: Lawrence W. Beason; Sheldon T. Wheaton, both of Olathe; Christopher J. Hanshew, Lenexa, all of Kans.

[73] Assignee: Garmin Communication and Navigation, Lenexa, Kans.

[21] Appl. No.: 265,006

[22] Filed: Jun. 23, 1994

[51] Int. Cl.⁶ ........................................... H05K 7/14
[52] U.S. Cl. ................. 361/799; 361/752; 361/796; 361/822; 361/823; 174/50
[58] Field of Search .................. 361/752, 753, 361/796, 799, 822, 823, 728, 824, 800, 798; 174/50; 439/327, 328, 345

[56] References Cited

U.S. PATENT DOCUMENTS

| | | |
|---|---|---|
| 4,138,711 | 2/1979 | Bremenour et al. . |
| 4,531,176 | 7/1985 | Beecher, II . |
| 4,780,604 | 10/1988 | Hasegawa et al. . |
| 4,780,791 | 10/1988 | Morita et al. . |
| 4,780,793 | 10/1988 | Ohtsuki . |
| 4,868,715 | 9/1989 | Putman et al. ............ 361/422 |
| 4,872,091 | 10/1989 | Maniwa et al. . |
| 4,905,124 | 2/1990 | Banjo et al. . |
| 4,955,817 | 9/1990 | Sugai . |
| 4,956,756 | 9/1990 | Maggelet ................ 361/415 |
| 4,974,120 | 11/1990 | Kodai et al. . |
| 5,017,767 | 5/1991 | Mizuno . |
| 5,031,076 | 7/1991 | Kiku . |
| 5,053,613 | 10/1991 | Onoda . |
| 5,068,765 | 11/1991 | Nimpoeno ................ 361/422 |
| 5,151,774 | 9/1992 | Mori et al. . |
| 5,153,818 | 10/1992 | Mukougawa et al. . |
| 5,161,169 | 11/1992 | Galano et al. . |
| 5,173,840 | 12/1992 | Kodai et al. . |
| 5,229,925 | 7/1993 | Spencer et al. ............ 361/422 |
| 5,288,237 | 2/1994 | Mizutani et al. . |
| 5,319,516 | 6/1994 | Perkins . |
| 5,330,360 | 7/1994 | Marsh et al. . |
| 5,335,145 | 8/1994 | Kusui . |
| 5,339,222 | 8/1994 | Simmons et al. . |
| 5,357,402 | 10/1994 | Anhalt . |
| 5,375,037 | 12/1994 | Le Roux . |
| 5,386,340 | 1/1995 | Kurz . |
| 5,397,857 | 3/1995 | Farquhar et al. . |
| 5,408,385 | 4/1995 | Fowler et al. ............ 361/784 |
| 5,414,253 | 5/1995 | Baudouin et al. . |
| 5,440,448 | 8/1995 | Stewart et al. . |
| 5,440,451 | 8/1995 | Saito et al. . |
| 5,446,622 | 8/1995 | Landry et al. . |

Primary Examiner—Leo P. Picard
Assistant Examiner—Y. Whang
Attorney, Agent, or Firm—Kokjer, Kircher, Bowman & Johnson

[57] ABSTRACT

An electronic storage device having IC chips mounted upon a board, with the board surrounded by a card housing. A portion of the card housing is formed of conductive material and is electrically connected to the board to allow the board to be easily grounded to reduce damage due to static electricity. The card is operatively received in a receptacle having a bay sized to receive the card. Upon insertion of the card into the bay, a grounding contact grounded to the receptacle may engage the conductive portion of the card housing to ground the card prior to the card contacts being operatively connected. The card preferably has a shape such that it may only be inserted into the bay in the proper orientation. The receptacle may have a power switch located to provide full access to the bay in the power-off position, but blocking bay access in the power-on position. This ensures that the card is not inserted while the receptacle is activated, and that the receptacle is deactivated prior to removing the card.

21 Claims, 2 Drawing Sheets

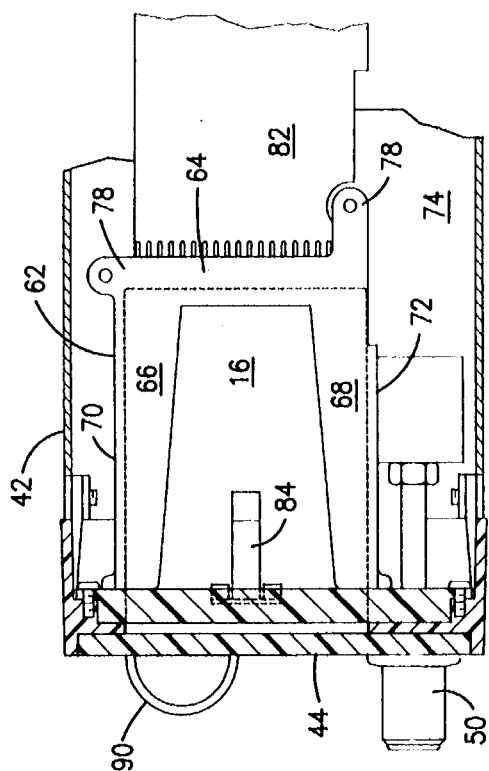
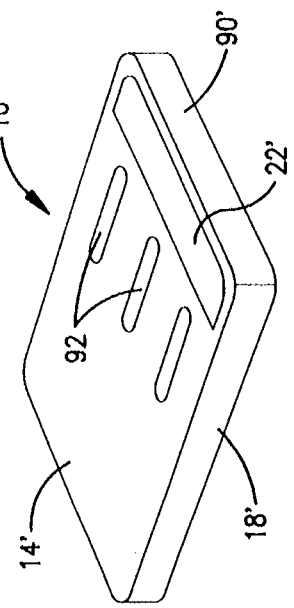
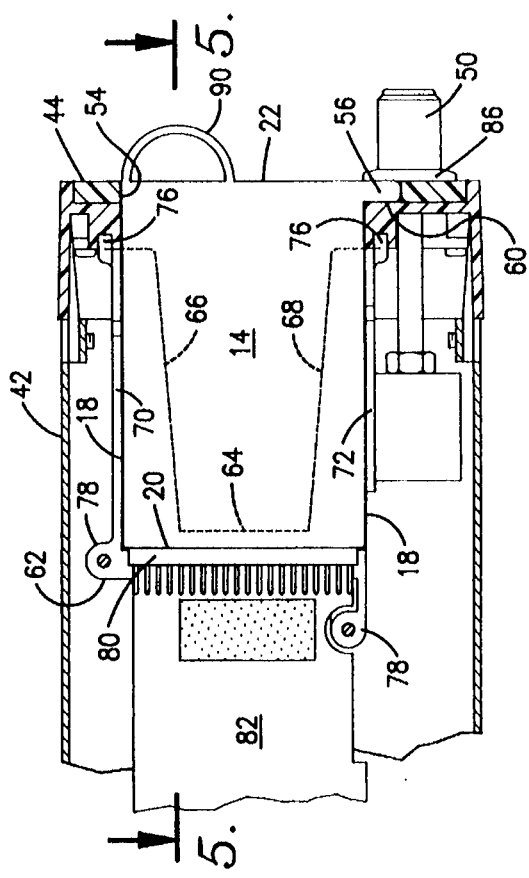
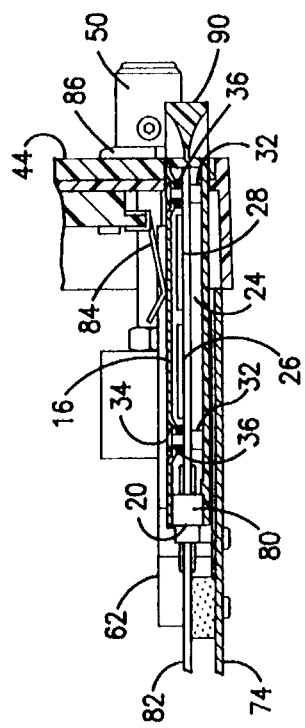

ELECTRONIC STORAGE DEVICE AND RECEPTACLE

BACKGROUND OF THE INVENTION

1. Field of the Invention

The present invention relates in general to electronic storage media and equipment employing same. In particular, the present invention relates to an improved data module and receptacle having static electricity grounding and interlock to prevent removal during use.

2. Description of the Related Art

In recent years it has become increasingly common to provide electronic devices with removable and replaceable data/memory devices to expand the functions of the device and/or ease their use in a particular situation. For example, such electronic devices include computers, numerical control tools, dedicated electronic devices such as warehouse stock tracking systems, etc. Various types of data/memory devices are also known. Perhaps the most common are magnetic tape and floppy discs and their associated drives, which are often used in office environments. In other environments with greater chance of damage to the data/memory device, such as machine shops, warehouses and children's toys, it is more typical to employ a cartridge or card having memory and/or other integrated circuit chips mounted therein. For example, video game cartridges and data cards for numerical control tools have been known to employ this configuration.

Even with the relatively rugged cartridge configuration, there is still danger of damage to the data or chips themselves due to static electricity. For this reason, it is known to place the contacts of the cartridge or card in a recessed position to avoid contact with exterior objects, such as the hand of the user.

Static electricity may also cause damage to the electronic device to which the cartridge is attached if there is a voltage differential between the cartridge and the device.

At least in certain applications or with certain types of cartridges and cards, there is also the need to maintain the cartridge securely in position during use, as inadvertent disconnection may interrupt operation of the electronic device with serious consequences. For certain electronic device and data/memory device combinations, it is further necessary to have the data/memory device in position prior to activating the electronic device for proper operation of the data/memory device.

SUMMARY OF THE INVENTION

An object of the present invention is to provide an electronic storage device which is rugged and reliable.

Another object of the present invention is to provide an electronic storage device and receptacle which reliably removes static electric charge from the storage device upon placement in the receptacle.

It is a further object of the present invention to reduce the risk of electric potential between the electronic storage device and the receptacle by grounding of the device to the receptacle prior to operative connection to the contacts of the device.

Yet another object of the present invention is to provide an electronic storage device and receptacle which ensure proper orientation of the card for insertion into the receptacle.

Another object of the present invention is to provide an electronic storage device and receptacle which coact to reliably maintain the storage device in position.

It is yet another object of the present invention to provide a receptacle which eliminates the possibility of cartridge or card insertion or removal while the receptacle is in a power-on condition.

These and other objects of the invention are achieved by an electronic storage device preferably in the form of an IC information card having IC chips mounted upon a board, with the board surrounded by a card housing. A portion of the card housing is formed of conductive material and is electrically connected to the board to allow the board to be easily grounded to reduce damage due to static electricity. The card is operatively received in a receptacle having a bay sized to receive the card. Upon insertion of the card into the bay, a grounding contact grounded to the receptacle may engage the conductive portion of the card housing to ground the card prior to the card contacts being operatively connected. The card preferably has a shape such that it may only be inserted into the bay in the proper orientation. The receptacle may have a power switch located to provide full access to the bay in the power-off position, but blocking bay access in the power-on position. This ensures that the card is not inserted while the receptacle is activated, and that the receptacle is deactivated prior to removing the card.

BRIEF DESCRIPTION OF THE DRAWINGS

The objects and features of the invention noted above are explained in more detail with reference to the drawings, in which like reference numerals denote like elements, and in which:

FIG. 3 is a cross-sectional left side view along line 3—3 of FIG. 2;

FIG. 4 is a cross-sectional right side view along line 4—4 of FIG. 2;

FIG. 5 is a cross-sectional plan view along line 5—5 of FIG. 3; and

FIG. 6 is a perspective view showing a second embodiment of the invention.

DETAILED DESCRIPTION OF THE INVENTION

Figure 1:
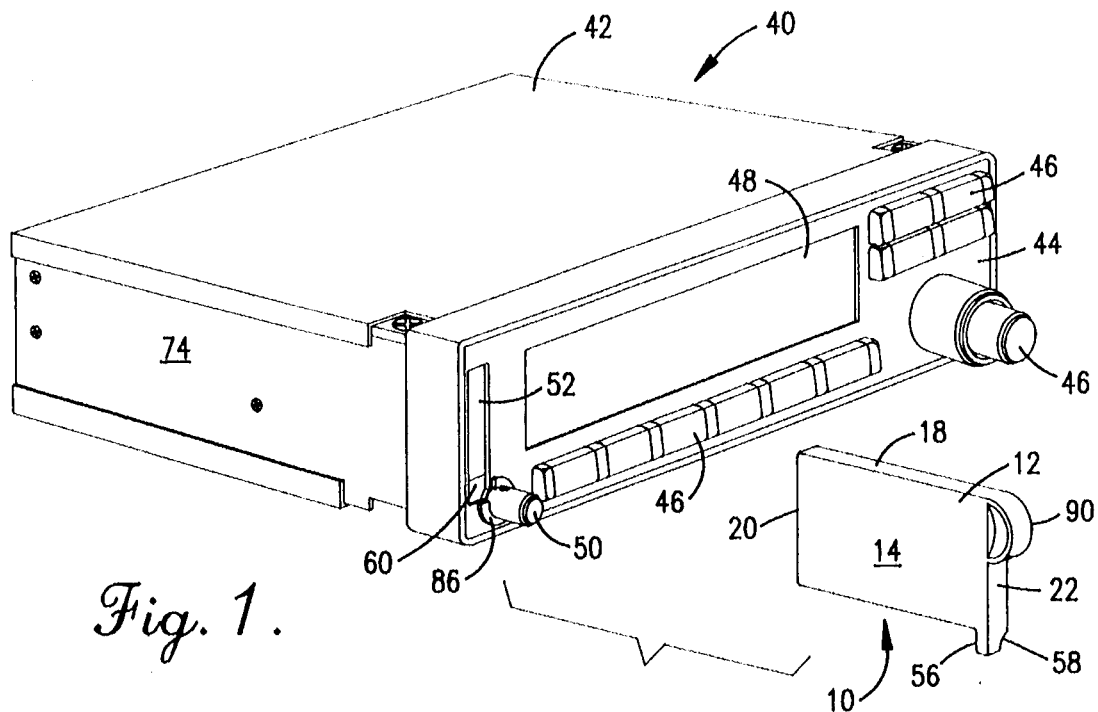
FIG. 1 is a perspective view of a storage device and receptacle according to the present invention, prior to insertion of the storage device.

With reference to FIG. 1, a storage device according to the present invention is generally designated by reference numeral 10. Storage device 10 takes the general form of a card or cartridge, typically having a generally rectangular configuration. The storage device 10 has an exterior housing 12. In the rectangular configuration shown, this will result in the device 10 having first and second major side faces 14 and 16 (16 being shown in FIG. 5) in spaced parallel relationship. Extending between these major faces are minor side faces 18, inner face 20 and outer face 22.

With reference to FIG. 5, these faces define an interior cavity 24 which houses the electronic components comprising the operative elements of the device 10. These components may take many forms, depending upon the desired function supplied by the device 10. Typically, these components will take the form of microprocessor and/or memory elements in the form of IC chips 26. If the components 26 take the form of memory, they may be any common type, such as RAM, ROM, EPROM, etc.

While the components 26 could be mounted to the interior of the cavity 24 directly, it is preferred that the components be mounted upon a printed circuit board 28, also located within the cavity. In the rectangular embodiment shown, the board 28 will typically be located in a plane parallel to the major faces 14 and 16. The components will be electrically connected to appropriate circuitry on the board, which leads to an external contact area 30 for the device. While this contact area may be located on any of the faces of the housing, it is preferred that it take the form of a standard connector operatively connected to the edge of the board closest to the inner face 20 of the housing. While the connector comprising the contact area 30 may simply be accessible through the inner face 20, in the preferred embodiment shown in FIG. 5, the connector actually serves as the inner face of the housing, thus reducing the amount of material need to form the housing. To prevent against pin bending and static electric damage, it is of course preferred that the connector be a female receptacle. Other contact arrangements, such as surface pads, may alternatively be employed.

To protect the board and components, the housing 12 will be substantially rigid, and the majority of the housing will be formed of a dielectric material, such as a non-conductive plastic. However, one aspect of the present invention is the provision of a conductive grounding area on the housing 12, which is in electrical contact with the board 28 to permit grounding to eliminate static electric potential.

The grounding area may be located upon, or comprise, any of the faces 14–22. In the embodiment shown, the grounding area conveniently comprises the second major face 16. In particular, the face 16 is formed of a separate sheet of material, with this material being electrically conductive and in grounding contact with the board and/or components. This separate sheet of material will typically be a metal. This particular arrangement provides various advantages.

First, forming the entire major face 16 as a separate element permits the remainder of the housing (faces 14 and 18–22) to be formed as a monolithic injection molded unit. This of course reduces manufacturing costs.

Second, assembly of this grounding area to the remainder of the housing may, at the same time, provide the electrical path between the grounding area and the board.

In particular, the interior of the first major face 14 may be provided with one or more mounting posts 32. The mounting posts 32 will extend into the cavity 24 and have free ends adapted to abut against one face of the board 28. At locations corresponding to the mounting posts, both the board 28 and the grounding area/major face 16 will include through-holes. Mounting studs 34 may then pass through the holes in the face 16 and board 28 and be secured to the mounting posts 32. This connection may be a threaded connection, adhesive, thermal bond, etc. This will secure the face 16 to the remainder of the housing. Alternatively, the posts 32 may be formed as stepped posts, with a reduced diameter free end passing through the face 16 and board 28, and thereafter being deformed, as by thermal or ultrasonic methods, to secure these elements together.

The electrical connection between the grounding area/face 16 may be effected in various ways. For example, the mounting studs could be formed of a conductive material and the through holes in the board 28 may be plated and connected to the grounding circuitry. Alternatively, the mounting holes in the face 16 may be recessed to an extent such that the interior surface of the face 16 at the mounting holes contacts the surface of the board 28 at locations corresponding to grounding circuitry. This provides the added benefits that the heads of the studs 34 are recessed, and that the recesses will serve to space the board from the remainder of the face 16.

In the preferred embodiment, the face 16 is recessed slightly (sufficient to recess the heads of the studs 34), and one or more conductive spacers 36 (which may conveniently be standard washers) surround the studs 34 intermediate the interior surface of the face 16 and the board 28. The recesses and the spacers together serve to provide the desired spacing of the remainder of the face from the board, and also provide electrical grounding communication.

The spacers will contact the surface of the board 28. In some applications this will be sufficient grounding for avoiding static potential problems, without the need for connection to an actual grounding circuit. Alternatively, the spacers may contact a grounding circuit on the board. This circuit could provide the entire ground for the components 26. Alternatively, this circuit could also be connected to a grounding pin on the pin connector forming the contacts.

This grounding feature of the device 10, along with other features, are made more clear by considering the actual use of the device. As is known in the art, data/memory devices such as device 10 are operatively connected to a receptacle during use. Such a receptacle may be a dedicated, stand-alone unit used solely for reading and/or writing to the device, and which is in turn connected to other electronic equipment. Alternatively, the receptacle may itself be the electronic equipment. As used herein, the term "receptacle" encompasses at least these arrangements.

With reference to FIG. 1, reference numeral 40 generally designates a receptacle 40 for use with the device 10. In this embodiment, the receptacle 40 is a piece of electronic equipment which reads from and/or writes to the device 10 in the performance of other functions. For example, the receptacle 40 may be a navigational aid for use in aircraft or watercraft which determines distances, headings, courses, etc., based upon data stored in the device 10.

While purely an example, the receptacle 40 may have a housing 42 which includes a front panel 44. The front panel may include various buttons and or knobs 46 used to access or initiate various specialized functions. There may also be provided an output display 48 for alphanumeric and/or graphical information. The receptacle 40 will also include a main power switch 50 for turning the receptacle on and off.

The receptacle 40 will also include a bay 52 which receives the device 10. The bay 52 will include an opening 54 in the housing 42 of the receptacle. In the embodiment shown in FIGS. 1–5, this opening is in the front panel 44. Additionally, in the embodiment shown, the bay is oriented vertically. This orientation permits the output display 48 to have a larger vertical extent than typical horizontal bay arrangements. The opening 54 will have a shape which closely receives the device 10. As such, the opening will have a shape corresponding to the cross-section of the device 10 in a plane parallel to the inner face 20.

It is preferred that there be provided an arrangement for ensuring that the device 10 is inserted in the proper orientation. This could be accomplished by providing the device 10 with a cross-sectional shape which is not symmetric, and the opening with a mating shape. However, this increases the complexity of the mold needed to form the housing 12. To still provide this function with reduced complexity, the device 10 is therefore provided with an alignment tail 56., best shown in FIG. 1.

The tail 56 is a cantilevered protrusion or extension of the outer face 22, extending normal to the minor faces 18. In the embodiment shown, the tail 56 is not symmetric in the cross-sectional plane. This is effected by removing a semi-circular portion from the free end of the tail adjacent the second major face 16 to define an alignment cutout 58.

The bay 52 is designed to receive a sufficient portion of the device 10 such that the tail 56 abuts against a recess in the face 44. The face 44 is therefore provided with a recess 60 which receives the tail 56 when the device is mounted in the bay. The recess 60 is provided with a mating configuration to the tail 56. In this manner the device 10 may only be fully received within the bay when the tail is received within the recess, which is only possible when/if the device 10 is properly oriented.

This arrangement therefore ensures proper orientation of the device in the receptacle. The production of the housing with such a tail is more complex than a housing having no tail, but is less complex than that required for many non-symmetric housing configurations.

It is also desirable to support the device 10 within the bay, both for stability and to ensure that the contacts 30 are located at the proper position upon insertion of the device 10 into the bay 52. To this end, there is provided a race 62.

As is best shown in FIGS. 3-5, the race 62 has a first planar side wall having a generally U-shaped configuration, with a cross bar portion 64 and first and second legs 66 and 68. This sidewall is arranged with the free ends of the legs adjacent the opening 54, and offset from the opening such that the sidewall will support the second major face 16 of the device. Extending perpendicular to the plane of the side wall, from each of the legs 66 and 68, are flanges 70 and 72, respectively. These flanges will support the minor faces 18 of the device 10.

The race could be provided with a second sidewall similar to the first, to thus support the first major face 14. The device would thus be received within a cavity defined by the race when in the operative position. However, in the embodiment shown, the bay 52 is closely adjacent to the housing 42 of the receptacle, and in particular a wall 74. As such, the free ends of the flanges 72 and 74 abut against this wall, and the wall 74 is employed to support the first major face 14.

The race 62 must of course be secured within the housing 42 of the receptacle 40. To this end the free ends of the legs 66 and 68 (or the ends of the flanges 70 and 72) adjacent the opening to the bay are provided with projections 76 which are received within mating holes in the housing 42, and in particular the face 44. This secures the race adjacent the opening. To secure the race adjacent the rear of the bay, the race is provided with appropriate lugs 78 which are secured (possibly via other components) to the housing 42. In the embodiment shown, the lugs 78 extend across the bay at the interior end and abut against interior surface of the wall 74. Appropriate screws may secure the lugs to the wall.

To ensure proper electrical connection of the device 10 upon insertion, it is preferred that the race 62 support a mating connector 80. In the embodiment shown, the mating connector takes the form of a male pin connector held in position by a close fit between the cross bar portion 64 of the race and the wall 74. The mating contacts are of course positioned such that the tail 56 of the device will be received within the recess 60 (if such are used) when the contacts 30 and 80 are in communication. The pin connector is electrically connected to the electronic circuitry of the receptacle 40, in this case via a printed circuit board 82.

While the above description of the bay provides a secure environment for the device 10 and ensures proper electrical connection, there is still the problem of a possible static electric potential between the device 10 and receptacle 40 which could damage either or both.

To solve this, the bay includes a wiper arm 84 (FIGS. 4 and 5) extending into the bay, and in particular between the legs 66 and 68. The wiper arm is oriented and positioned such that it will contact the grounding area of the device 10 prior to the device 10 being operatively inserted within the bay. In the embodiment shown, the wiper arm therefore contacts the second major face 16.

In particular, the wiper arm 84 is mounted to either the housing 42 (such as the face 44) or race 62, and extends toward the face 16. The wiper arm is formed of a resilient electrically conductive material, such that it will press against the face 16 and make electrical contact. The wiper arm is also electrically connected to a ground of the receptacle 40, typically the housing 42. As such, the face 16, and thus the board and/or components in the device 10 will be grounded prior to engagement between the contacts 30 and 80. This will ensure that any static electric potential between the device and receptacle are dissipated.

In addition to the problem of static potential, with certain types of components, it is necessary for the receptacle to be in a power off condition during insertion of the device 10. Once full insertion has been achieved, the receptacle 10 may thereafter be placed in a power-on state. Additionally or alternatively, there are applications were it is detrimental to remove the device 10 from the receptacle while the receptacle is in a power-on state. Where this is the case, the preferred embodiment provides for this.

Figure 2:
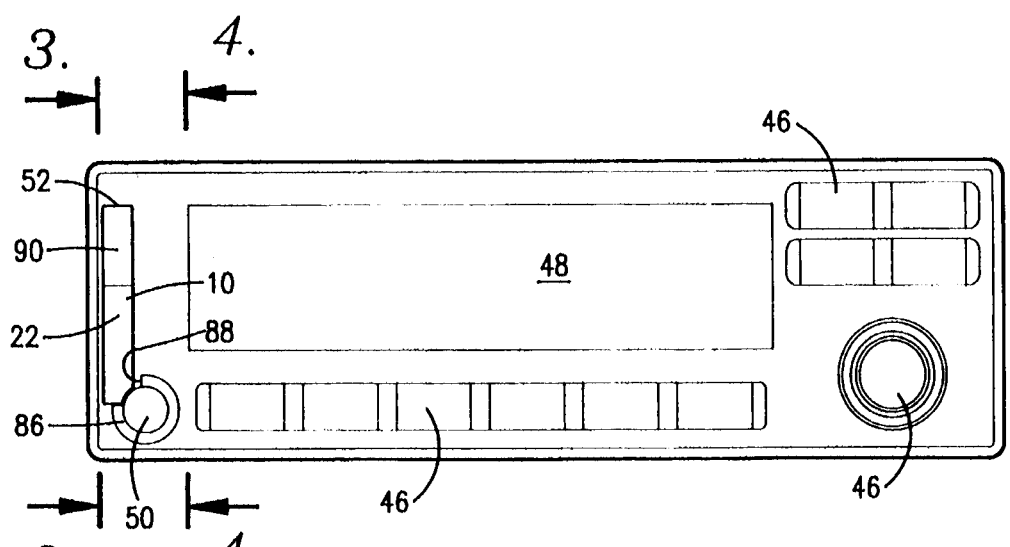
FIG. 2 is a front view of the storage device and receptacle, with a power switch in an off position.

In particular, and with reference to FIGS. 1-3, the power switch control 50 may be placed in a position to interfere with access to the bay 52. In the embodiment shown, the power switch control takes the form of a rotary knob having a flange 86. The rotational axis of the knob is positioned relative to the opening to the bay such that the flange may extend across the opening. The flange 86 has a portion removed to define a cut out section 88. This cut out section is angularly located such that it is over the opening when knob 50 is positioned for the power-off state, but is not over the opening when the knob is positioned for the power-on state.

As such, the device 10 is blocked from entering or leaving the bay when the knob 50 is in the power-on position. This eliminates the possibility of inadvertent insertion or removal of the device at a time which prevents operation or might cause damage.

As may be envisioned, a similar arrangement may be achieved with power switches of other types. For example, a sliding switch could allow access during power-off, but block the opening during power-on. With the preferred embodiment, there is the added feature that the circular periphery of the knob 50 at the cut out 88 may correspond to the cut out 58 in the tail 56 of the device 10, thus combining the orientation/polarization assurance with the insertion/removal assurance.

As may be seen from the drawings, when the device 10 is operatively inserted within the bay, the outer face 22 may be substantially flush with the panel 44 of the receptacle. Where this is the case, it is preferred to provide the device 10 with a handle 90 on its outer face. This will clearly facilitate manual grasping of the device for removal from the bay. By permitting this manual removal, there is no need for a costly ejector mechanism.

With reference to FIG. 6, a second embodiment of a device 10 is shown. In this embodiment the majority of components are identical to the first, with the exception of the arrangement for assuring proper orientation. In this embodiment the tail has been removed, and the first major face 14' is provided with a plurality of ribs 92 extending in a direction parallel to the insertion and removal direction. The opening of the bay (not shown) may then have appropriate mating recesses, assuring proper orientation. A second difference is the handle 90', which in this embodiment extends the full length of the outer face 22'.

From the foregoing it will be seen that this invention is one well adapted to attain all ends and objects hereinabove set forth together with the other advantages which are obvious and which are inherent to the structure.

Various modifications of the present invention may of course be made. For example, if the receptacle is to used in a marine environment, the opening to the bay may be located on a bottom face of the housing to reduce the possibility of water ingress.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative, and not in a limiting sense.

What is claimed is:

1. An electronic storage device received within a bay of a receptacle, comprising:

a housing having a plurality of faces including an inner face;

at least one electronic component within said housing;

at least one contact on said inner face electrically connected to said component; and a grounding area on one of said faces other than said inner face, said grounding area being in electrical contact with said component.

2. A device as in claim 1, wherein one of said plurality of housing faces is an outer face, and further including a tail extending from said outer face in a plane parallel to said inner face.

3. A device as in claim 1, wherein said housing defines an interior cavity, and a printed circuit board is mounted within said cavity, said component being mounted upon said board, and wherein said grounding area is in electrical contact with said board.

4. A device as in claim 3, wherein one of said plurality of housing faces is an outer face, and further including a tail extending from said outer face in a plane parallel to said inner face.

5. A device as in claim 3, wherein said grounding area comprises one of said plurality of faces other than said inner face.

6. A device as in claim 5, wherein said housing is generally rectangular, and includes first and second major faces in spaced parallel relation, first and second minor faces and an outer face, with said minor, inner and outer faces extending between said major faces, and wherein said grounding area comprises said second major face.

7. The device of claim 1, in combination with a receptacle having a bay to receive said device in an operative position, wherein said receptacle includes a wiper arm extending into said bay at a position to contact said grounding area when said device is inserted into said bay and prior to reaching said operative position, said wiper arm being electrically grounded within said receptacle.

8. The combination of claim 7, wherein said housing defines an interior cavity, and a printed circuit board is mounted within said cavity, said component being mounted upon said board, and wherein said grounding area is in electrical contact with said board.

9. The combination of claim 8, wherein said grounding area comprises one of said plurality of faces other than said inner face.

10. The combination of claim 9, wherein said housing is generally rectangular, and includes first and second major faces in spaced parallel relation, first and second minor faces and an outer face, with said minor, inner and outer faces extending between said major faces, and wherein said grounding area comprises said second major face.

11. A device as in claim 1, wherein one of said plurality of housing faces is an outer face, and further including a tail extending from said outer face in a plane parallel to said inner face, and further in combination with a receptacle having a bay to receive said device in an operative position, wherein said receptacle includes an opening leading into said bay, and a recess adjacent said opening, said recess constructed and arranged to receive said tail when said device is in said operative position.

12. The combination of claim 11, wherein said receptacle includes a wiper arm extending into said bay at a position to contact said grounding area when said device is inserted into said bay and prior to reaching said operative position, said wiper arm being electrically grounded within said receptacle.

13. The combination of claim 12, wherein said housing defines an interior cavity, and a printed circuit board is mounted within said cavity, said component being mounted upon said board, and wherein said grounding area is in electrical contact with said board.

14. The combination of claim 13, wherein said grounding area comprises one of said plurality of faces other than said inner face.

15. The combination of claim 14, wherein said housing is generally rectangular, and includes first and second major faces in spaced parallel relation, first and second minor faces and an outer face, with said minor, inner and outer faces extending between said major faces, and wherein said grounding area comprises said second major face.

16. The device of claim 1, in combination with a receptacle having a bay to receive said device in an operative position, said receptacle having an opening leading into said bay and a main power switch movable between an on and an off position, said power switch in said off position permitting full access to said opening for said device, and in said on position blocking access to said opening for said device.

17. The combination of claim 16, wherein said power switch in said on position prevents movement of said device from said operative position.

18. The combination of claim 16, wherein said receptacle includes a wiper arm extending into said bay at a position to contact said grounding area when said device is inserted into said bay and prior to reaching said operative position, said wiper arm being electrically grounded within said receptacle.

19. The combination of claim 18, wherein said housing defines an interior cavity, and a printed circuit board is mounted within said cavity, said component being mounted upon said board, and wherein said grounding area is in electrical contact with said board.

20. The combination of claim 19, wherein said housing is generally rectangular, and includes first and second major faces in spaced parallel relation, first and second minor faces and an outer face, with said minor, inner and outer faces extending between said major faces, and wherein said grounding area comprises said second major face.

21. An electronic storage device received within a bay of a receptacle, comprising:

a tray, formed of a dielectric material, defined by a major face having first, second, third, and fourth peripheral edges and a plurality of side wall portions defining a rim along said first, second, and third peripheral edges of said tray;

at least one electronic component mounted, intermediate said side wall portions, within said tray;

an electrical connector positioned along said fourth peripheral edge of said tray and connected to said electronic component; and a cover plate, formed of conductive material, positioned on said tray in parallel relationship to said major face thereof and in electrical contact with said electronic component, wherein said electronic component is thus positioned between said cover plate and said major face of said tray.

\* \* \* \* \*